United States Patent
Nakamichi et al.

(10) Patent No.: US 8,248,784 B2
(45) Date of Patent: Aug. 21, 2012

(54) DISPLAY APPARATUS

(75) Inventors: Masaya Nakamichi, Kizugawa (JP); Shohei Takahashi, Daito (JP)

(73) Assignee: SANYO Electric Co., Ltd., Moriguchi-Shi (JP)

( * ) Notice: Subject to any disclaimer, the term of this patent is extended or adjusted under 35 U.S.C. 154(b) by 22 days.

(21) Appl. No.: 12/894,944

(22) Filed: Sep. 30, 2010

(65) Prior Publication Data

US 2011/0085302 A1    Apr. 14, 2011

(30) Foreign Application Priority Data

Sep. 30, 2009   (JP) ................... 2009-226909
Sep. 30, 2009   (JP) ................... 2009-226910

(51) Int. Cl.
H05K 7/20 (2006.01)
(52) U.S. Cl. ............... 361/679.5; 361/679.46; 361/692; 361/752
(58) Field of Classification Search ............ 361/679.21–679.22, 679.26–679.27, 679.29–679.3, 679.46, 361/679.49, 679.51, 690, 692, 694, 695, 361/752, 796
See application file for complete search history.

(56) References Cited

U.S. PATENT DOCUMENTS

| 5,869,919 | A * | 2/1999 | Sato et al. ................... 313/17 |
| 6,805,446 | B2 * | 10/2004 | Arai et al. ................... 353/61 |
| 7,995,342 | B2 * | 8/2011 | Nakamichi et al. ........... 361/696 |
| 8,035,968 | B2 * | 10/2011 | Kwon et al. .................. 361/695 |
| 2009/0310059 | A1 * | 12/2009 | Kim et al. .................... 349/58 |

FOREIGN PATENT DOCUMENTS

JP        2005-286987 A     10/2005

* cited by examiner

Primary Examiner — Courtney Smith
(74) Attorney, Agent, or Firm — NDQ&M Watchstone LLP

(57) ABSTRACT

A display apparatus has a display panel, a circuit unit which controls the display panel, a first chamber which accommodates the display panel, a second chamber which arranged behind the first chamber, the second chamber accommodates the circuit unit, a cooling device which cools the display panel, and a ventilating part which ventilates between the first and the second chamber. The air emitted from the cooling device is led to the back side of the display panel via the front side thereof, and then ventilates the ventilating part.

4 Claims, 6 Drawing Sheets

DISPLAY APPARATUS

This application is based on Japanese Patent Application No. 2009-226909 and 2009-226910, which are filed on Sep. 30, 2009, the contents of which are hereby incorporated by reference.

BACKGROUND OF THE INVENTION

1. Field of the Invention

The present invention relates to a display apparatus having a liquid crystal panel.

2. Description of Related Art

Conventionally, display apparatus was designed on the premise of indoor installation (for example, see JP 2005-286987A1), and such apparatus did not have measures to protect its display panel or circuit board for controlling the panel from rainstorm or dust. Thus, such display apparatus is unsuitable for outdoor installations.

In order to realize the outdoor installation, it can be considered to form an accommodation chamber having a waterproofing structure inside the housing and to accommodate the display panel and the circuit in the chamber However, if the panel and the circuit board are accommodated in the same chamber, the temperature of the chamber is easily raised because of the heat generated from the panel and the board. Thus, the performance of the panel may degrade because of its temperature and the image displaying may be disabled. Further, the temperature increase may cause trouble in the circuit board.

SUMMARY OF THE INVENTION

A display apparatus of the present invention comprises:

a display panel;

a circuit unit which controls the display panel;

a first chamber which accommodates the display panel;

a second chamber which arranged behind the first chamber, the second chamber accommodates the circuit unit;

a cooling device which cools the display panel, and a ventilating part which ventilates between the first and the second chamber, wherein air emitted from the cooling device is led to the back side of the display panel via the front side thereof, and then ventilates the ventilating part.

DETAILED DESCRIPTION OF PREFERRED EMBODIMENTS

A display apparatus according to an embodiment of the present invention is discussed in detail below with reference to drawings.

The First Embodiment

Figure 1:
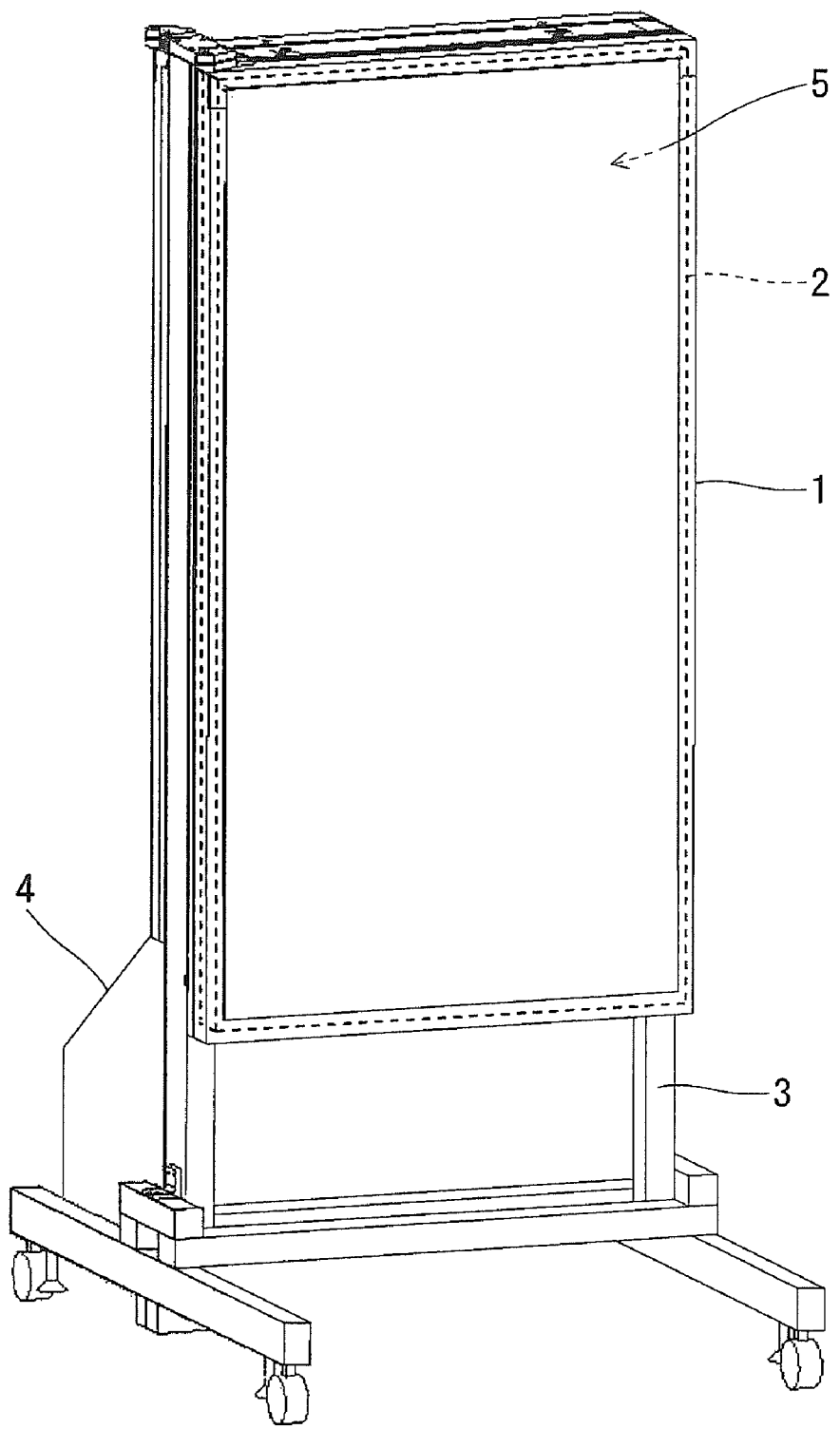
FIG. 1 is a perspective diagram of the display apparatus 100 viewed from the front side.

As shown in FIG. 1, a display apparatus 100 comprises a housing 1, a liquid crystal display panel 2 arranged in the housing 1, a support base 3 for supporting the housing 1, and a cooling device 4. The support base 3 has a caster attached therewith. The panel 2 utilizes a light emitting diode (LED) as a light source for image display.

Figure 2:
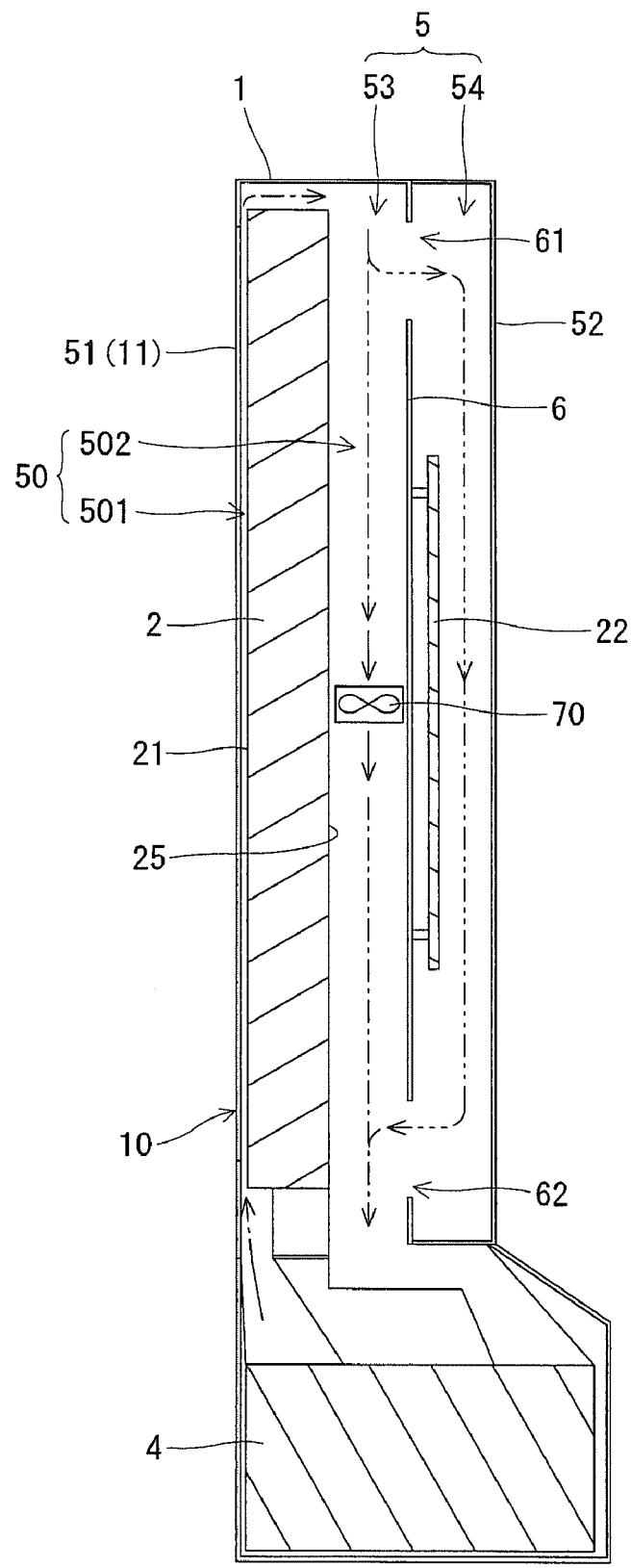
FIG. 2 is a perpendicular sectional view of the apparatus 100.

As shown in FIG. 2, the housing 1 includes therein a chamber 5 having a sealed structure. A front wall 51 of the chamber 5 is formed by a front wall 11 of the housing 1, and the wall 11 is made of an optically transparent material such as a glass material. In contrast, an upper wall, a bottom wall (lower wall), both side walls (i.e. left side wall and right side wall) and a rear wall 52 of the chamber 5 are made of a metal such as aluminum.

The accommodation room 5 is divided into a front side domain 53 and a rear side domain 54 by a board component 6. The domain 53 is located along the front wall 51, and the domain 54 is located along the rear wall 52. In the board component 6, a pair of openings 61 and 62 is formed in its upper side and lower side respectively.

In the front side domain 53, the panel 2 is accommodated so that the screen 21 thereof faces toward the wall 51. Thereby, a portion, where it face the screen 21, of the wall 51 forms an image display window 10 which makes the screen 21 viewable from outside of the housing 1.

In the front side domain 53, a circulation path 50 which surrounds the panel 2, passing the front side and the rear side of the panel 2 is formed. Specifically, the path 50 has a first path 501 which passes between the screen 21 and the window 10, and a second path part 502 which passes between the back 25 of the panel 2 and the board component 6. The path 501 and 502 are communicated each other in their upper ends. Further, the path 501 and 502 are communicated each other in their bottom ends via the cooling device 4 in the bottom part of the chamber 5.

In the front side domain 53, a fan 70 is further accommodated within, and the fan 70 is arranged facing its intake side upwards and exhaust side downward at the rear side of the panel 2. Therefore, by operating the fan 70, the air inside the path part 502 flows downward along the back side of the panel 2, and flows into the path part 501 from its bottom side via cooling device 4. Then, the air inside the path part 501 flows upward along the front side of the panel 2. Further, the air passes the upper side of the panel 2, and flows into the path part 502 from its upper side. Thus, by operating the fan 70, the air inside the domain 53 circulates along the circulation path 50.

In the rear side domain 54, the circuit board 22 which controls the panel 2 is accommodated. The circuit board 22 is attached on the board component 6, and on an area between the openings 61 and 62.

The cooling device 4 has an evaporator which collects the heat inside the path 50, and the condenser which emits the heat collected by the evaporator outside the path 50. The evaporator and the condenser is connected each other by a pipe in which a coolant flows. Further, the device 4 has a compressor which compresses the coolant which flows into the condenser from the evaporator. Therefore, the coolant having a high pressure and a high temperature flows into the condenser. Therefore, the heat collected by the evaporator is efficiently emitted by the condenser. Therefore, air circulating inside the path 50 is cooled, and thereby the air in the front side domain 53 is cooled.

According to the apparatus 100, since the panel 2 and the board 22 is accommodated in the chamber 5 having a sealed structure the panel 2 and the board 22 are protected from rainstorm, dust and the like when the apparatus 100 is installed outside.

Further, the chamber 5 is divided into domain 53 and 54 by the board component 6 (wherein the domain 53 accommodates the panel 2, and the domain 54 accommodates the circuit board 22), and thereby the board component 6 intervenes between the panel 2 and circuit board 22. Thus, a heat generated from the panel 2 hardly transmits to the board 22.

On the other hand, a heat generated from the panel 2 stays inside the domain 53, and a heat generated from the board 22 stays inside the domain 54. Thereby, a temperature inside the domains 53 and 54 may rise easily. By cooling device 4, the air inside the domain 53 is cooled and temperature rise in the domain 53 is inhibited. As a result, the temperature rise of the panel 2 is inhibited and the panel 2 is maintained in the normal state.

Further, by the air circulating the path 50, not only the heat generated from the rear side of the panel 2, but the heat generated from the front side of the panel 2 is collected. Thus, the panel 2 is cooled efficiently.

In the apparatus 100, the air in the rear side of the panel 2 flows downward along the panel 2 by operating the fan 70. In this situation, the upper opening 61 corresponds to upstream and the lower opening 62 corresponds to downstream. Thereby, as shown in a dashed-two dotted line of FIG. 2, a portion of an air in the rear side of the panel 2 flows into the rear side domain 54 via the opening 61. Then, the air flown into domain 54 passes through the domain 54, and returns to the front side domain 53 via lower opening 62.

Since the air in the front domain 53 is cooled by the cooling device 4, a portion of the cooled air passes through the rear domain 54. As a result, the temperature rise in the domain 54 is inhibited and can prevent trouble in the circuit board 22.

According to the apparatus 100, the fan 70 is arranged facing its intake side upward. However, the scope of the present invention is not limited to this. The fan 70 may be arranged so that the intake side faces downward. When the fan 70 is arranged in this manner, air inside the path part 502 flows upward, and air inside the path part 501 flows downward.

The parts 501 and 502 of the circulation path 50 may be communicated each other in their respective side ends. In this case, the fan 70 is arranged so that its intake side faces sideward.

According to the apparatus 100, the pair of openings 61 and 62 is located vertically. However, the scope of the present invention is not limited to this. If the apparatus has a structure in which the air in the rear side of the panel flows laterally, it is preferable to arrange the pair of openings in the horizontal direction.

In apparatus 100, three or more openings may be arranged in the board component 6.

Figure 3:
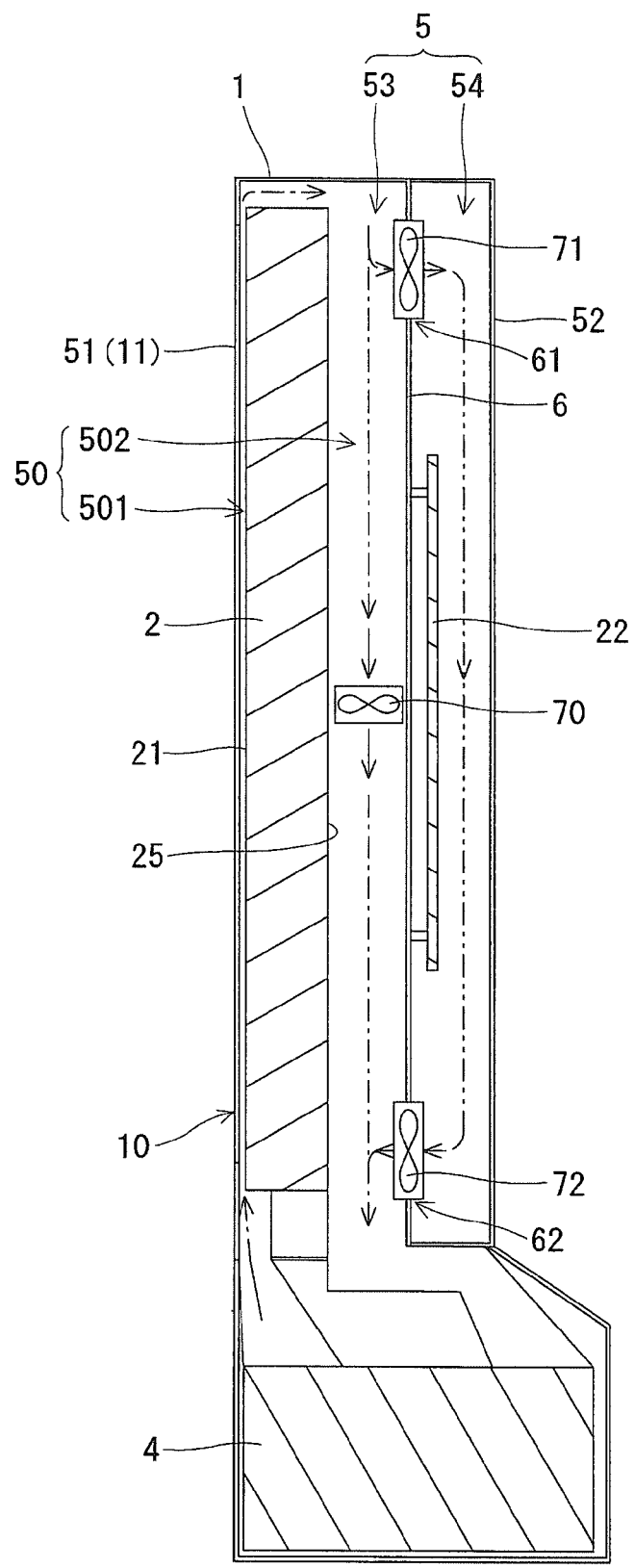
FIG. 3 is a perpendicular sectional view of the apparatus 200.

FIG. 3 is a perpendicular sectional view of the display apparatus 200. In the apparatus 200, a fan 71 is arranged inside an upper opening 61, and a fan 72 is arranged inside lower opening 62. Here, the fan 71 is arranged so that its intake side faces the front side domain 53 and the exhaust side faces the rear side domain 54. The fan 72 is arranged so that its intake side faces the rear side domain 54 and the exhaust side faces the front side domain 53.

Thus, by operating the fan 71, the air inside the domain 53 moves to the domain 54 via the opening 61. The air inside the domain 54 moves to the domain 53 via the opening 62.

According to the apparatus 200, by operating the fan 71, it can expedite the air in the rear side of the panel 2 flowing into the domain 54 via the opening 61. Further, by operating the fan 72, as shown in a dashed two-dotted line with arrow in FIG. 3, it can expedite an air flow in the domain 54. Thus, the circuit board 22 can be cooled efficiently.

Figure 4:
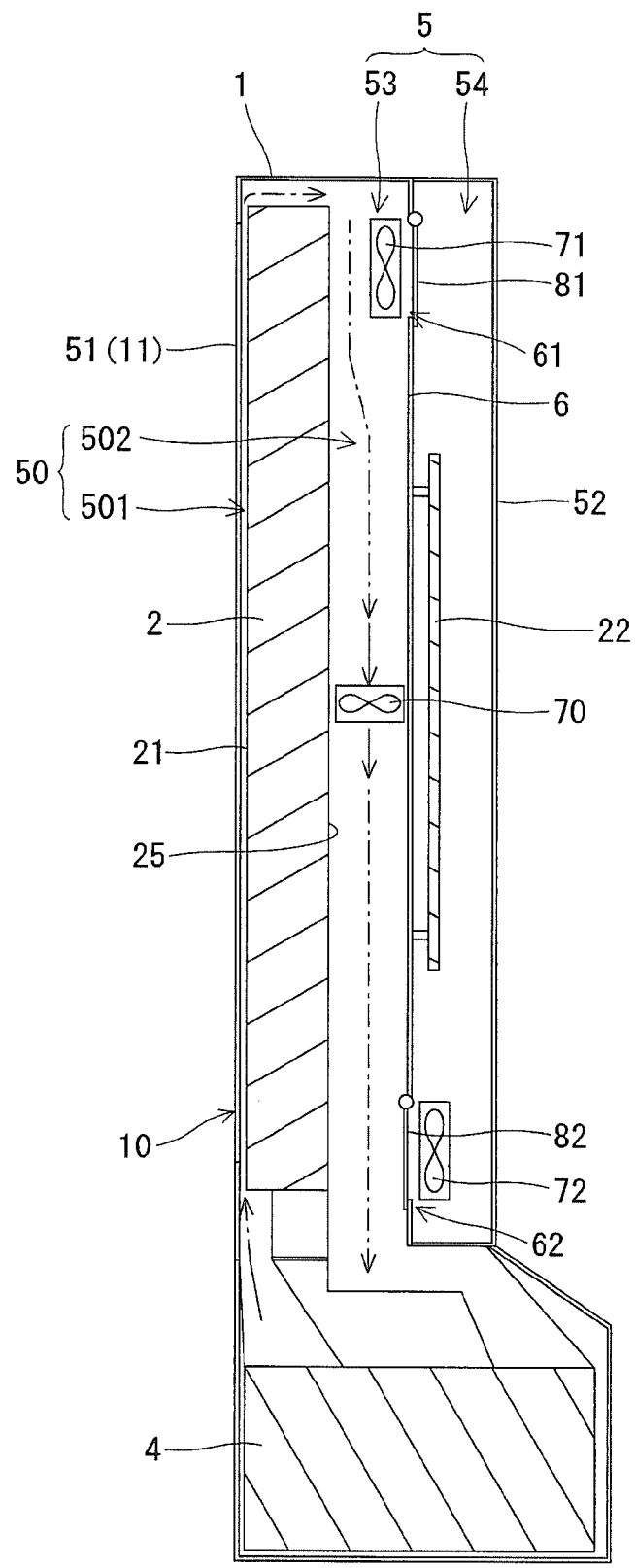
FIG. 4 is a perpendicular sectional view of the apparatus 300.

FIG. 4 is a perpendicular sectional view of the display apparatus 300. In the apparatus 300, a first flap 81 which covers the upper opening 61 and a second flap 82 which covers the lower opening 62 are pivoted in the board component 6. The flap 81 is attached to the board 6 so that it can be opened toward the domain 54. The flap 82 is attached to the board 6 so that it can be opened toward the domain 53.

In the domain 53, a fan 71 is arranged near the upper opening 61. In the domain 54, a fan 72 is arranged near the lower opening 62. Here, the fan 71 is arranged so that its exhaust side faces the opening 61, and the fan 72 is arranged so that its exhaust side faces the opening 62.

Figure 5:
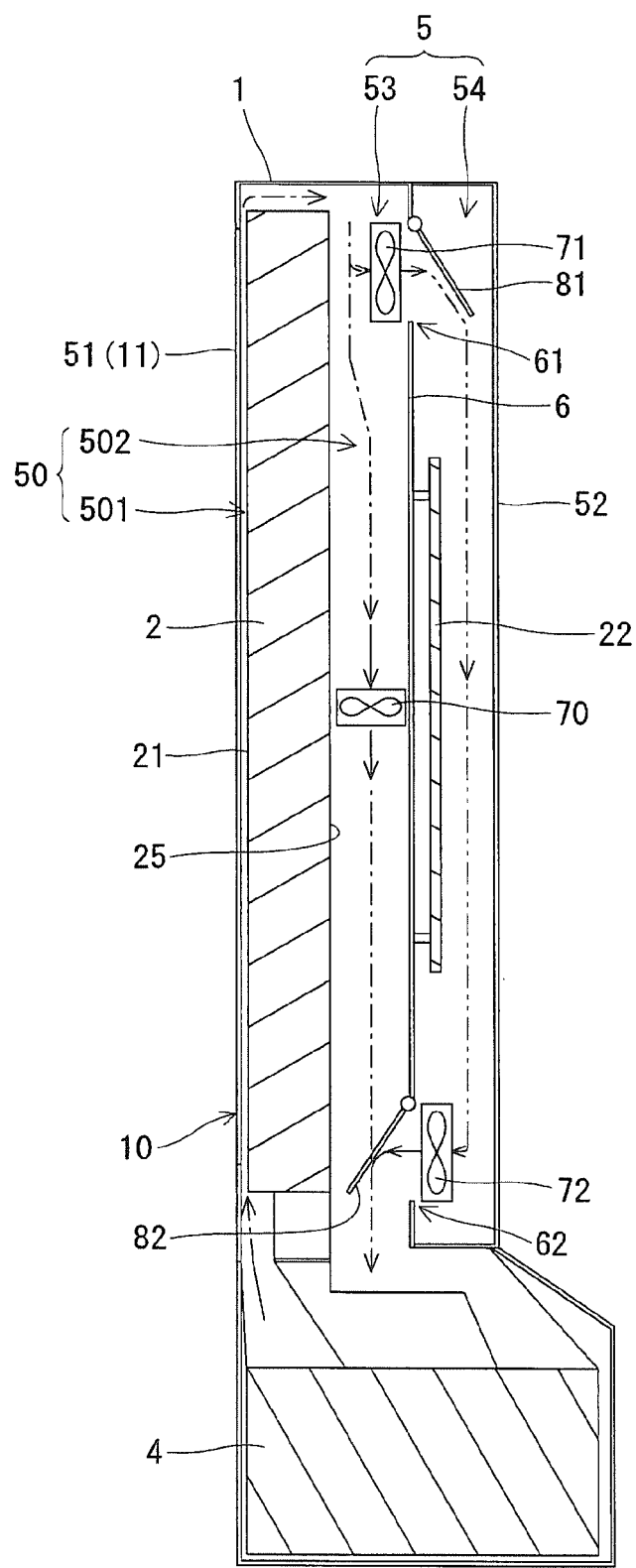
FIG. 5 is a perpendicular sectional view of the apparatus 300 introducing the action of a fan and a flap equipped therewith.

Therefore, by operating the fan 71, the flap 81 opens toward the domain 54 due to a wind pressure from the fan 71 as shown in FIG. 5. Similarly, by operating the fan 72, the flap 82 opens toward the domain 53 due to a wind pressure from the fan 72.

Figure 6:
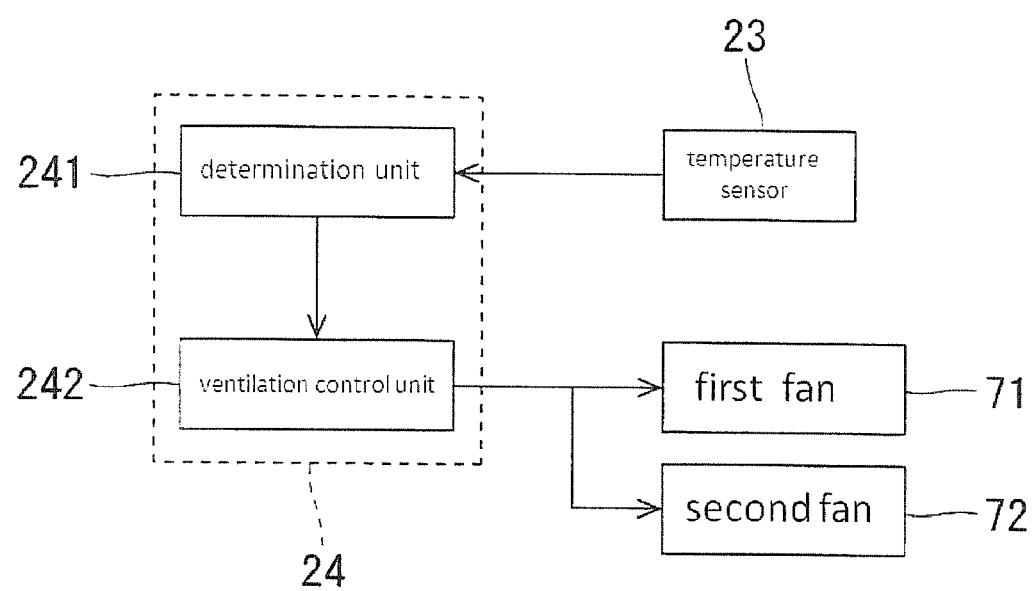
FIG. 6 is a block diagram showing a constitution of a fan controlling unit equipped with the apparatus 300.

As shown in FIG. 6, the apparatus 300 further comprises a temperature sensor 23 which detects temperature in the rear side domain 54, and control unit 24 which controls the operation of the fans 71 and 72. The sensor 23 outputs temperature information by detecting the temperature in the domain 54. The control unit 24 controls the fans 71 and 72 based on the information outputted from the sensor 23.

The unit 24 has a determination unit 241 and a ventilation control unit 242. The unit 241 determines whether the temperature in the domain 54 is higher than a predetermined temperature or not based the information outputted from the sensor 23. The unit 242 activates the fans 71 and 72 when the unit 241 determined that the temperature is higher than the predetermined. The unit 242 deactivates these fans when the unit 241 determined that the temperature is lower than the predetermined. Here the predetermined temperature is set up as a temperature in which the circuit board damages due to overheating.

According to apparatus 300, fans 71 and 72 are activated when the temperature in the domain 54 become higher than a predetermined temperature. As a result, the flaps 81 and 82 open as shown in FIG. 5.

Thereby, air cooled by the cooling device 4 can pass through the domain 54, and thus a trouble in the circuit board 22 is prevented.

On the other hand, when the temperature in the domain 54 become lower than the predetermined temperature as a result of the activation of the fans 71 and 72, the fans 71 and 72 are deactivated (i.e. operation is terminated). Accordingly, the energy consumption is reduced compared to an apparatus in which the fans are activated regardless of the temperature in the domain 54.

The path parts 501 and 502 may be connected each other in their side ends. In this case, the fan 70 is arranged so that its exhaust side faces to the lateral direction.

When the temperature in the 54 becomes lower than the predetermined, and the operation of the fans 71 and 72 are terminated, the flaps 81 and 82 are closed and the openings 61 and 62 are covered. As a result, transfer of the air between the domains 53 and 54 is blocked. Thereby, the front side domain 53 is cooled efficiently by the cooling device 4, and the temperature of the panel 2 is kept low.

The present invention is not limited to the foregoing embodiment in construction but can be modified variously within the technical range set forth in the appended claims. The configuration employed in the display apparatus described above can be applied not only to the display apparatus with the panel 2, but also to display apparatuses with various image display panels such as a plasma display, or an organic EL (Electro-Luminescence) display.

What is claimed is:

1. A display apparatus comprising:
   a display panel;
   a circuit unit which controls the display panel;
   a first chamber which accommodates the display panel;
   a second chamber which arranged behind the first chamber, the second chamber accommodates the circuit unit;
   a cooling device which cools the display panel, and
   a ventilating part which ventilates between the first and the second chamber, wherein
   air emitted from the cooling device is led to the back side of the display panel via the front side thereof, and then ventilates the ventilating part;
   wherein the ventilating part comprises:
   a first opening which ventilates an air flowing from the first chamber to the second chamber, and
   a second opening which ventilates an air which passed the circuit unit back to the first chamber.

2. The apparatus of the claim 1, further comprises:
   a first fan arranged near the first opening, leading the air in the first chamber to the second chamber, and
   a second fan arranged near the second opening, leading the air in the second chamber to the first chamber.

3. The apparatus of the claim 2, further comprises:
   a first flap arranged at the first opening, and
   a second flap arranged at the second opening, wherein
   the first flap opens toward the second chamber by an air flow generated by the first fan, and
   the second flap opens toward the first chamber by an air flow generated by the second fan.

4. The apparatus of the claim 2, further comprises:
   a temperature sensor which detects the temperature in the second chamber, and
   a control unit which controls the first and the second fan, wherein
   the control unit activates the first and/or second fan when the temperature detected by the temperature sensor is higher than the predetermined value, and
   the control unit deactivates the first and/or second fan when the detected temperature is lower than the predetermined value.

* * * * *